US006047344A

United States Patent [19]

Kawasumi et al.

[11] Patent Number: 6,047,344

[45] Date of Patent: Apr. 4, 2000

[54] SEMICONDUCTOR MEMORY DEVICE WITH MULTIPLIED INTERNAL CLOCK

[75] Inventors: Atsushi Kawasumi; Shinji Miyano, both of Yokohama, Japan

[73] Assignee: Kabushiki Kaisha Toshiba, Kawasaki, Japan

[21] Appl. No.: 09/034,218

[22] Filed: Mar. 4, 1998

[30] Foreign Application Priority Data

Mar. 5, 1997 [JP] Japan .................................... 9-050316

[51] Int. Cl.[7] ............................ G06F 13/42; G06F 12/00; H04L 7/00

[52] U.S. Cl. ........................... 710/107; 713/400; 711/100

[58] Field of Search .................................... 714/720, 735, 714/738, 733, 718; 710/1, 100, 129; 365/189.02, 201, 233; 324/211; 711/100; 713/400, 501; 370/463, 512

[56] References Cited

U.S. PATENT DOCUMENTS 5,457,696 10/1995 Mori ........................................ 714/720
5,499,384 3/1996 Lentz et al. ................................ 710/1
5,598,554 1/1997 Litaize et al. ...................... 395/500.02

*Primary Examiner*—Gopal C. Ray
*Attorney, Agent, or Firm*—Banner & Witcoff, Ltd.

[57] ABSTRACT

The practical operation speed of the memory device is increased by multiplexing input and output signals so as to increase the internal operation frequency higher than the external clock frequency. The feature of the memory device of the present invention is that it has the function of making the internal operation frequency higher than the external clock frequency by making the external bit width larger than the internal bit width, writing write data by dividing them successively by time division operation, into those having an internal bit width, and allocating read data to use an entire external bit width. According to the present invention, the practical operation speed of the memory device assembled on the board can be increased over the upper frequency limit of signals transmitted through the wiring on the board, and the high frequency performance of the memory device can be tested at the step of the die sorting test.

25 Claims, 9 Drawing Sheets

SEMICONDUCTOR MEMORY DEVICE WITH MULTIPLIED INTERNAL CLOCK

BACKGROUND OF THE INVENTION

The present invention relates to a memory device, and more specifically to a high-speed memory device.

Conventionally, a synchronous memory device, an external clock frequency and an internal operation frequency of which are equal to each other, is used for both write and read operations. FIGS. 1 and 2 are a block diagram showing the structure of a conventional memory device, and a timing diagram illustrating timing waveforms of a read operation.

The memory device shown in FIG. 1 consists of a memory cell array 1, a row decoder 2, a column decoder 3, an address input 4 and an external input/output section 12.

The external input/output section 12 is the section through which data from outside is written in the memory device, and data is read from the memory device. Such a section is generally called the input/output section (to be called I/O hereinafter) of a memory device; however, in this description, the section will be called external I/O so as to clarify the contrast between the structure of the conventional technique and that of the present invention.

The external bit width 12*a* shown in the diagram indicates the number of data (number of I/O) which can access the memory device at the same time, and the internal bit width 11 indicates the number of data which can be accessed by an address set.

As can be seen in FIG. 1, in the conventional semiconductor memory device, an internal bit width 11 and an external bit width 12*a* are not particularly distinguished from each other, but both internal bit width 11 and external bit width 12*a* are set to, for example, 4 bit. That is, simply, four lines are connected to the I/O of the memory device.

FIG. 2 is a timing diagram illustrating the read operation of the conventional memory device. As shown in this figure, address data $A_0$, $A_1$, $A_2$, . . . , are input in synchronism with an external clock. The internal clock frequency used for controlling the internal operation of the memory device is equal to the external clock frequency, and therefore write data $Q_0$, $Q_1$, written in a memory cell array are read from an external I/O in synchronism with the external clock frequency.

FIG. 3 is a timing diagram illustrating the write operation of the conventional memory device. As shown in this figure, address data $A_0$, $A_1$, $A_2$, . . . , are address input data in synchronism with an external clock. In similar to the read case, the internal clock frequency used for controlling the internal operation is equal to the external clock frequency, and therefore write data $D_0$, $D_1$, $D_2$, . . . , are written in a memory cell array in synchronism with the external clock frequency.

As described above, in the read and write operations of the conventional device, the internal operation frequency is set equal to the external clock frequency. With such a structure, for example, even when the memory device is operable for a frequency region higher than the external clock frequency, the operation is limited by the external clock frequency and cannot fully exhibit its high-speed performance.

More specifically, for example, when the memory device is assembled on a board, I/O data including an external clock, an address signal, and read/write data, are transmitted on the board, and therefore the repetition frequencies of these signals are inevitably limited by the upper frequency limit of the board.

Recently, as the miniaturization of the semiconductor memory device proceeds, the internal operation frequency of the device is improved so remarkably that the device, in many times, exhibits a high speed performance which exceeds the upper frequency limit of the board. In such a case, it is extremely important to have a technique for realizing the high speed operation of the whole system including the memory device itself assembled on the board, by rendering the memory device internally operate beyond the frequency limit of the board.

Apart from the above, the conventional semiconductor memory device is known to entail the following drawback, in the function test on the device. That is, after the completion of a wafer process, the function of the memory device formed on the silicon wafer is tested with a die sorting tester. However, mainly due to the upper limitation of the frequency of the prober, the speed selection and function selection of the memory device on the silicon wafer cannot be executed at the same time.

It should be noted here that the die sorting test is a function test for an integrated circuit on a silicon wafer, conducted in a comparatively lower frequency range, and more specifically, a die having a function fault is marked with use of a prober, and a chip containing the function fault is selected after die separation.

Generally, the high frequency characteristics of a prober used in a die sorting test are significantly low as compared to the high frequency performance of the test stage equipped in a large sized high speed tester. Under these circumstances, the below-described measures are taken in the conventional die sorting test. More specifically, first, only the selection of a die containing a function fault is carried out in comparatively lower frequency range. Then, the speed selection is carried out in the following manner. That is, a silicon wafer is cut off into chips, and those chips which passed the function selection by the die sorting test are sealed in excellent high speed packages. After that, the packages are once again mounted to the test stage of the high speed tester, to be subjected to the function selection including the operation speed.

As described above, conventionally, in the die sorting test before sealing in a package, the assurance of the function is possible only at lower speed, that is, impossible at high speed. In other words, conventionally, the full range of the operation frequency cannot be assured. As a result, in the case where chips are sealed in the packages after a die sorting test, and an operation frequency test is carried out with use of the large sized high speed tester, the operation frequency range, in some cases, does not reach the specification value. Thus, the conventional technique entails the drawback of a cost of using the large sized high speed tester and a cost of the expensive high speed packages discarded together with defective devices, which cause a high cost for the nondefective device.

BRIEF SUMMARY OF THE INVENTION

As described above, in the conventional synchronous memory device assembled on a board, if the internal operation frequency of the device exceeds the upper frequency limit of the board, it is limited by the upper frequency limit of a signal transmitted on wiring made on the board, and therefore the high internal operation frequency contained by the memory device cannot be fully utilized.

Further, after the completion of a wafer process, when memory devices on the wafer are subjected to a die sorting test, they cannot be tested in a high frequency range due to the problem entailed in the measurement system, that is, the high frequency characteristics of the prober are poor, and therefore it is conventionally required that a further selection should be made for the operation speed after sealing devices in the packages. The use of the expensive large sized high speed tester increases the production cost. Further, at the same time, if a fault in a high frequency range is found, the defective device is discarded together with an expensive high speed package, and therefore the cost for the high speed package directly reflects in an increase in the production cost for the non-defective device.

The present invention has been proposed as a solution to the above-described problem of the conventional technique, and the object thereof is to make it possible to establish a high speed system by providing it with a memory device having the following characteristics. That is, the internal operation frequency of the memory device is set higher than the external clock frequency, and input/output data is multiplexed or demultiplexed, so that the internal operation of the memory device is carried out at a frequency higher than the upper frequency limit of signals transferred through the wiring on the assembly board. Further, the present invention provides a memory device including peripheral circuits capable of evaluating the high frequency performance of the memory device in the step of the die sorting test of the memory devices formed on the silicon wafer.

The memory device of the present invention is characterized by having the function of making the internal operation frequency higher than the external clock frequency by making the external bit width larger than the internal bit width, writing write data by dividing them successively by time division operation into those having an internal bit width within the memory device, and allocating read data to use an entire external bit width.

More specifically, the memory device of the present invention is the type for performing write and read operations of external I/O data in synchronism with an external clock, which is characterized by including: a multiplying circuit for generating an internal clock, which is of an integral multiple of the external clock, and obtained by multiplying the external clock; an external I/O for performing write and read operations to and from the memory device at a predetermined external bit width; and internal I/O for performing write and read operations to and from a memory cell array of the memory device at a predetermined internal bit width, wherein the write and read operations to and from the memory cell array are controlled by the internal clock, and the internal bit width is set smaller than the external bit width.

Further, the memory device of the present invention is characterized in that it is assembled on a board on which the external clock and the external I/O data are propagated, and the write and read operations of the external I/O data are performed in synchronism with the external clock.

It is preferable with regard to the memory device of the present invention that the internal bit width should be a reciprocal of an integral multiple of the external bit width.

It is preferable with regard to the memory device of the present invention that the external input data of the write operation be converted from parallel to serial by an I/O multiplexing circuit, and written in the memory cell array of the memory device, and the external output data of the read operation be converted from serial to parallel by the I/O multiplexing circuit, and read from the memory cell array of the memory device to outside.

It is preferable with regard to the memory device of the present invention that the memory device has a burst mode such that the address input signal inputted in synchronism with the external clock is converted to an internal address signal having the same frequency as that of the internal clock by a burst counter circuit which operates in synchronism with the internal clock.

It is preferable with regard to the memory device of the present invention that the memory device has a burst mode such that the column address input signal inputted in synchronism with the external clock is converted to an internal address signal having the same frequency as that of the internal clock by a burst counter circuit which operates in synchronism with the internal clock.

It is preferable with regard to the memory device of the present invention that a test pattern of the memory device having a high fault detection rate is formed by using the internal address signal converted to have the same frequency as that of the internal clock by the burst mode, and write and read test data converted to have the same frequency as that of the internal address by an I/O multiplexing circuit.

The memory device of the present invention is characterized in that address signals inputted in parallel in synchronism with the external clock are converted to serial signals having the same frequency as that of the internal clock, and inputted to a decoder circuit.

Further, it is preferable with regard to the memory device of the present invention that a column address input signals inputted in parallel in synchronism with the external clock are converted to serial signals having the same frequency as that of the internal clock, and inputted to a column decoder.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Embodiments of the present invention will now be described in detail with reference to the accompanying drawings.

Figure 1:
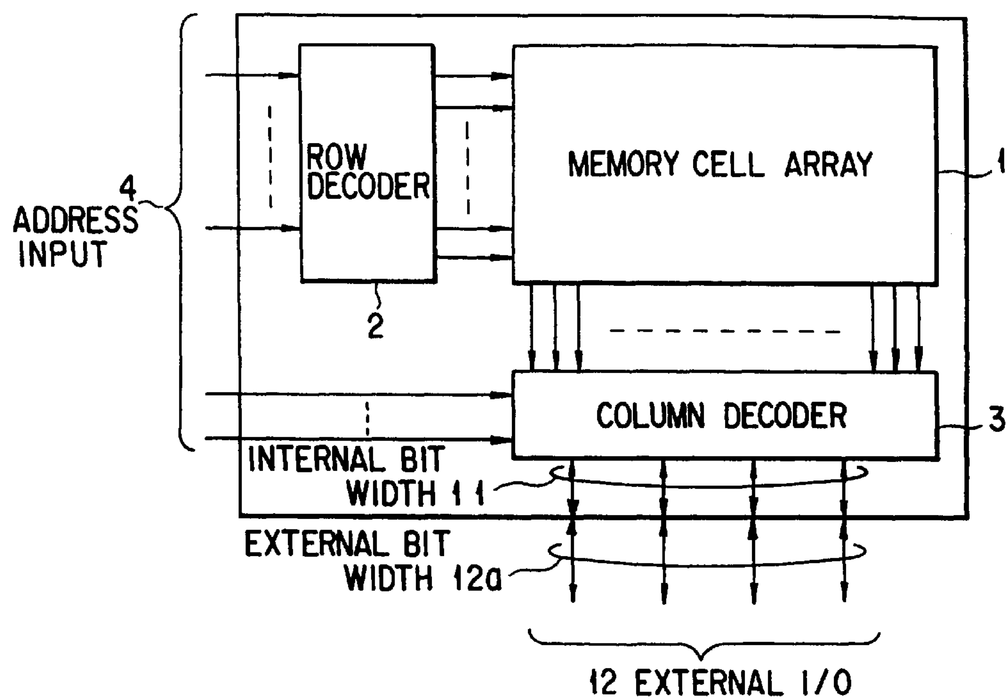
FIG. 1 is a block diagram showing the structure of the conventional synchronous memory device.
Figure 2:
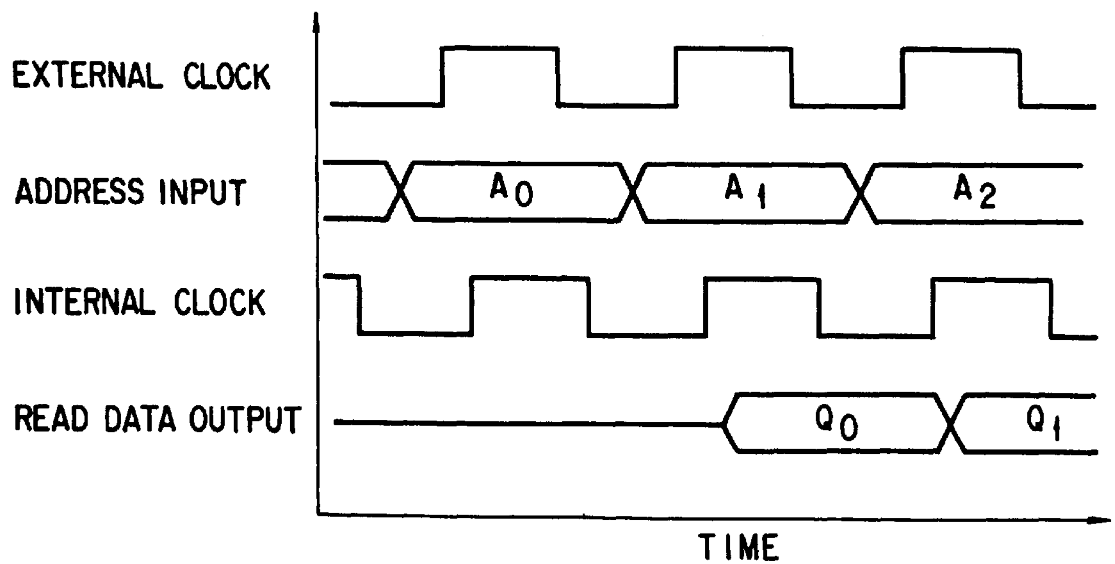
FIG. 2 is a timing diagram illustrating a read operation of the conventional synchronous semiconductor memory device.
Figure 3:
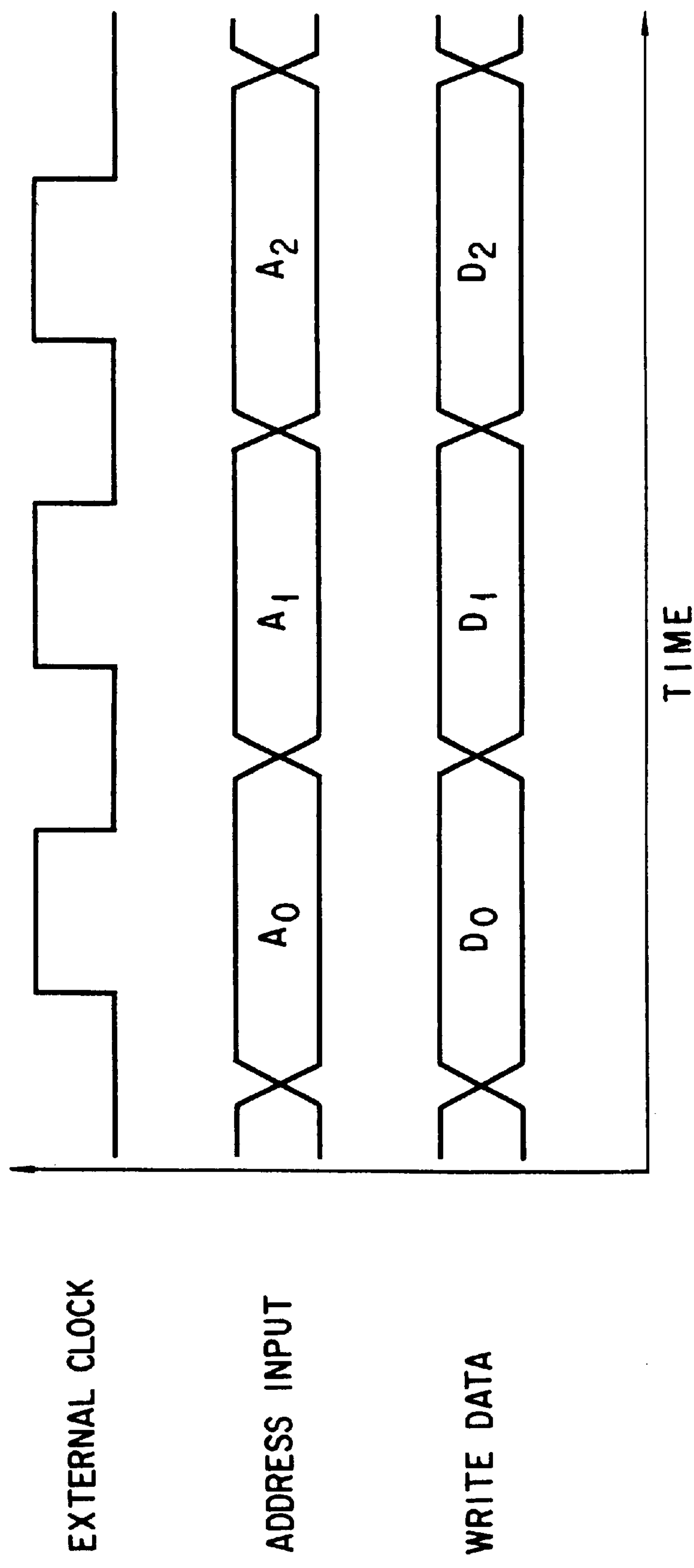
FIG. 3 is a timing diagram illustrating a write operation of the conventional synchronous semiconductor memory device.
Figure 4:
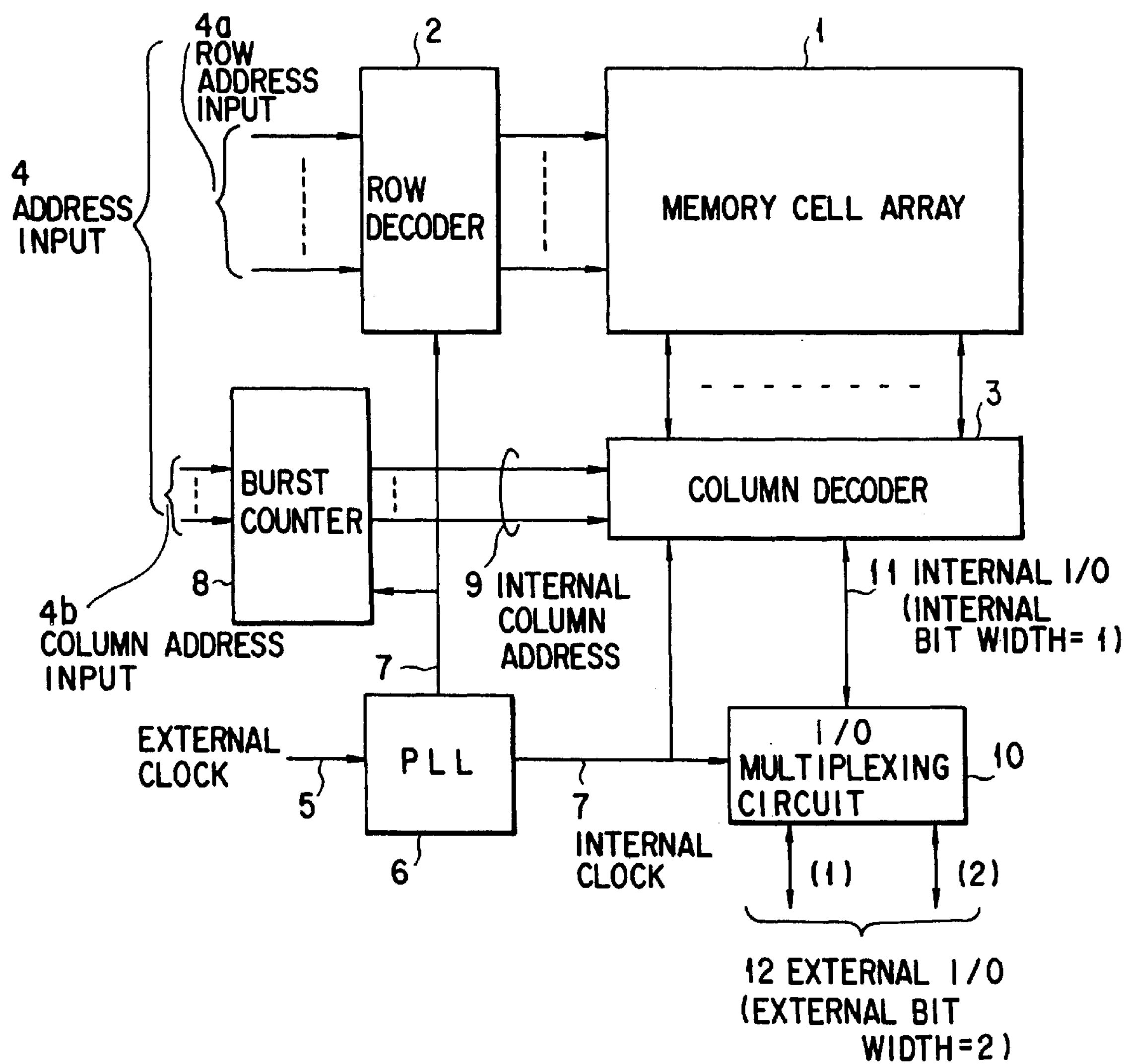
FIG. 4 is a block diagram showing the structure of a synchronous memory device according to the first embodiment of the present invention.

FIG. 4 is a block diagram showing the structure of a memory device according to the first embodiment of the present invention. The memory device includes a memory cell array 1, a row decoder 2, a column decoder 3, an address input 4, a row address input 4*a*, a column address input 4*b*, an external clock 5, a PLL (phase lock loop) circuit 6, an internal clock 7, a burst counter 8, an internal column address 9, an I/O multiplexing circuit 10, an internal I/O 11 and an external I/O 12.

In FIG. 4, in order to make the description simple, the internal bit width in the internal I/O is set to 1, whereas the external bit width in the external I/O is set to 2. An external input/output signal is input to the I/O multiplexing circuit 10 via the external I/O input terminals (1) and (2).

It should be noted that the internal bit width indicates the number of data which can be accessed by an address set, and the external bit width indicates the number of data (number of external I/O) which can be accessed by the memory device at the same time.

The I/O multiplexing circuit is a parallel serial conversion circuit for converting parallel data to serial data or vice versa. More specifically, write data input from the external I/O 12 is converted from parallel signal to serial signal, and then written in the memory cell array 1 via the column decoder 3, or data written in the memory cell array 1 is converted from serial signal to parallel signal, and read from the external I/O 12.

In the burst counter 8, an arithmetic operation operating on the basis of a predetermined rule in synchronism with the internal clock 7 multiplied by the PLL circuit 6, is added to the column address input 4*b* inputted to the burst counter 8 in synchronism with the external clock 5. The burst counter 8 is a circuit which operates as described above, and thus can generate new internal column addresses 9 in the same number as the multiplied number in time series.

It should be noted that the predetermined rule may be, for example, an operation that 1 is added to a binary code assigned to a column input address. A memory device containing such a burst counter 8 is called a memory device containing a burst mode.

Figure 5:
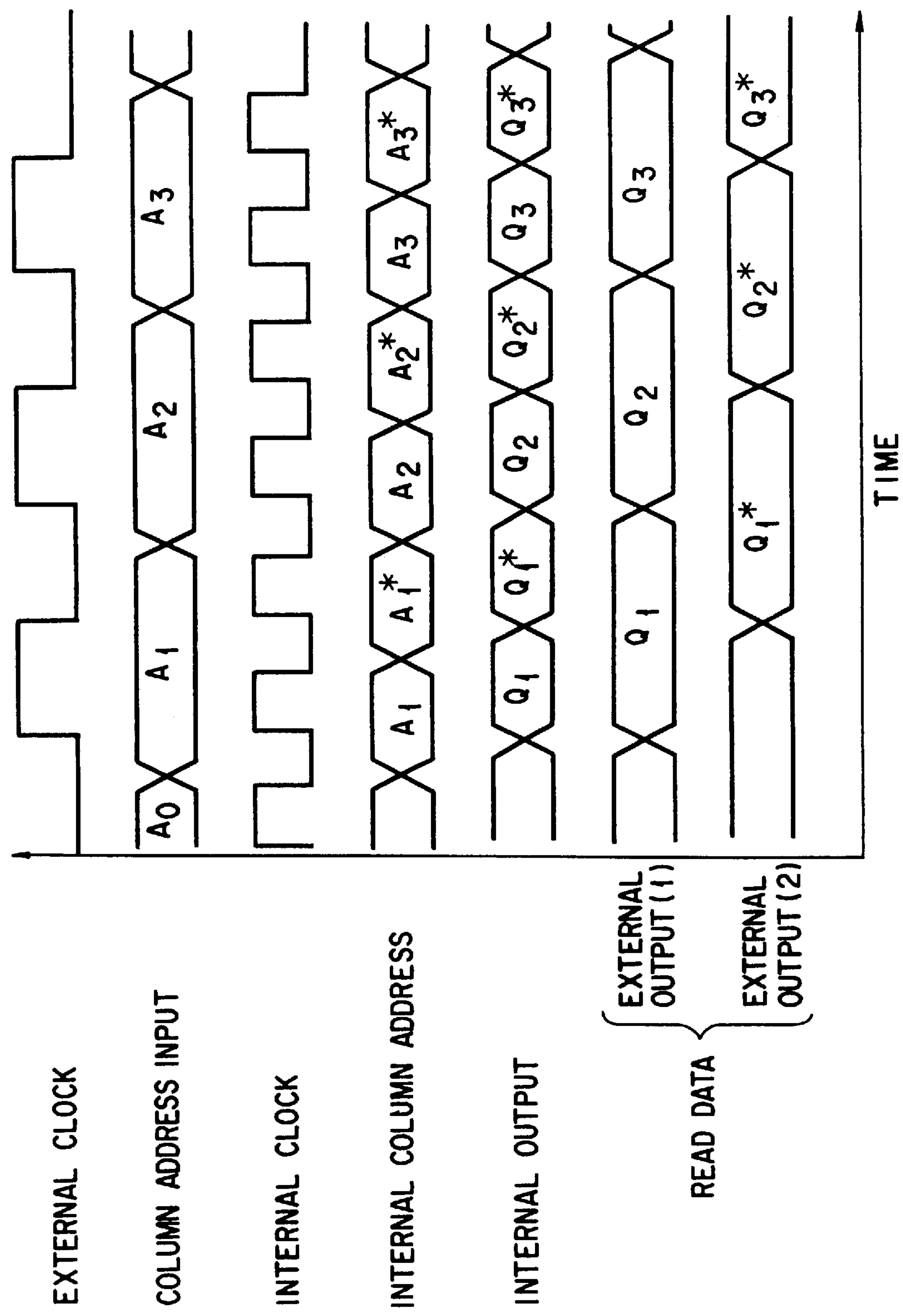
FIG. 5 is a timing diagram illustrating a read operation of the synchronous memory device according to the first embodiment of the present invention.

FIG. 5 is a timing diagram illustrating a read operation of the memory device according to the first embodiment of the present invention. The read operation will now be described with reference to FIGS. 4 and 5.

A column address input 4*b* is inputted to the counter in synchronism with the external clock 5, and the external clock 5 is multiplied by 2 by the PLL circuit 6, and converted into the internal clock 7. For example, inputted column addresses $A_0$ to $A_3$ are converted to internal column addresses $A_1$, $A_1$*, etc. having the same frequency as that of the internal clock 7 by the internal clock 7 and the burst counter 8, as shown in FIG. 5. It should be noted that $A_1$ * is an address obtained by adding an operation carried out on the basis of the predetermined rule, to $A_1$ as described above.

For example, the predetermined rule may be such as that when $A_1$ is 1010, $A_1$* is 1011, $A_2$ is 1100, $A_2$* is 1101, and $A_3$ is 1110, $A_3$* is 1111.

Thus, $Q_1$ and $Q_1$ * at addresses $A_1$ and $A_1$* are read, and these data are sub-divided into two output data $Q_1$ and $Q_1$* by the I/O multiplexing circuit 10, to be read from an external output (1) and external output (2). The frequency of the output data read is the same as that of the external clock 5.

The write operation of the memory device according to the first embodiment of the present invention will now be described with reference to FIGS. 4 and 6.

For example, column address input $A_1$, and write data $D_1$ and $D_1$ * inputted via the external input (1) and external input (2) are in synchronism with the external clock 5. The frequency of the external clock 5 is multiplied by 2 by the PLL circuit 6, into an internal clock, and the column address input $A_1$ and the like are converted into internal column addresses $A_1$ and $A_1$* or the like, by the burst counter 8, as in the read case.

Figure 6:
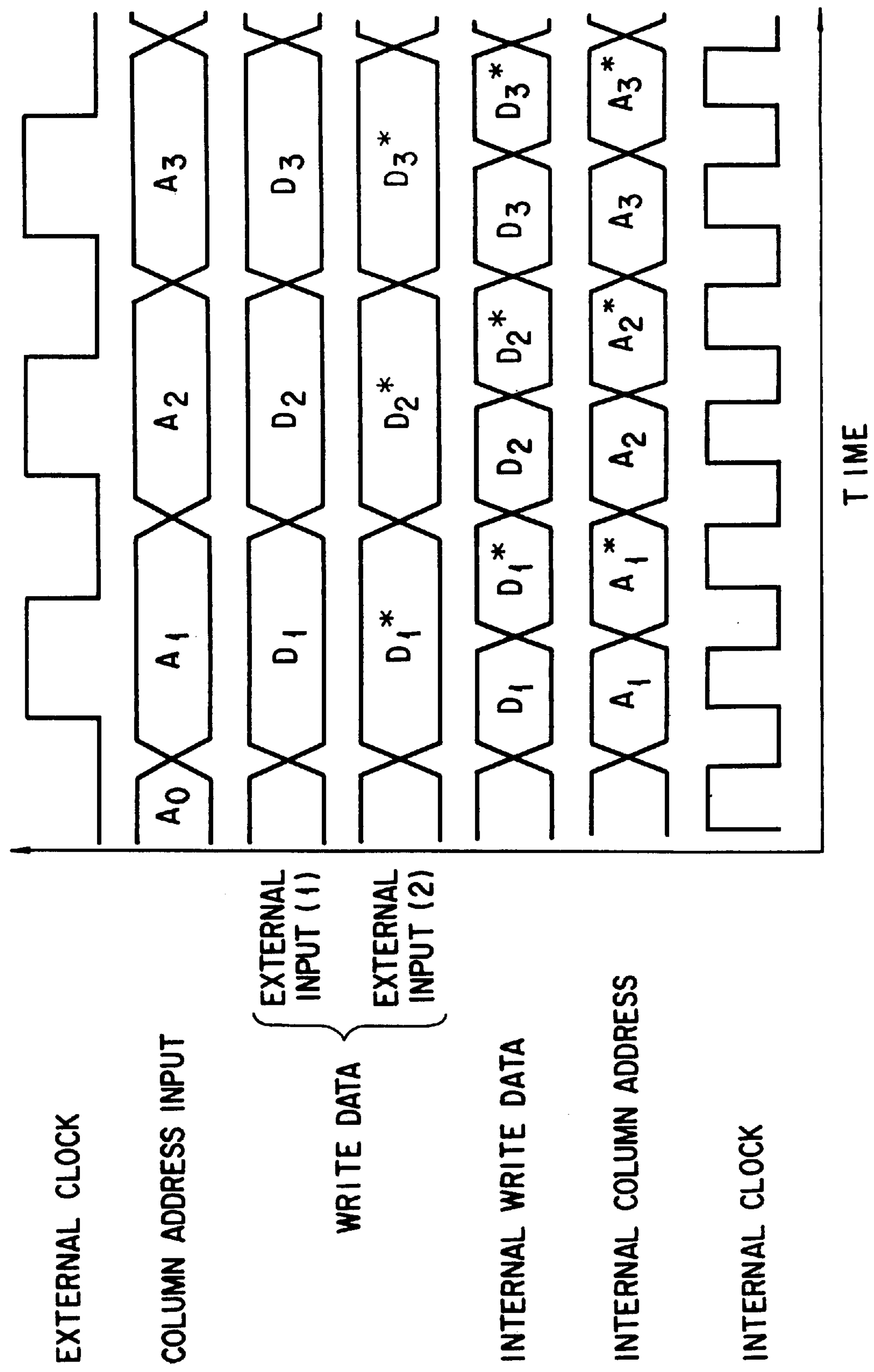
FIG. 6 is a timing diagram illustrating a write operation of the synchronous memory device according to the first embodiment of the present invention.

As shown in FIG. 6, from the third to fifth items from above, write data $D_1$ and $D_1$* having an external bit width of 2 are converted into internal write data $D_1$ and $D_1$* having a frequency twice as high and an internal bit width of 1, by the internal clock 7 having a frequency twice as high as that of the external clock 5 and the I/O multiplexing circuit 10. Thus converted data are written in the memory cell using internal column address $A_1$ and $A_1$* which is synchronized with the internal clock multiplied by 2.

With the above-described structure, when the internal operation speed of the memory device is sufficiently high and it is operable in a frequency range twice as high as the frequency of the external clock, the frequency of the read and write of data to the memory cell array 1 can be made practically twice as high as the frequency of the external clock. Therefore, it is possible to establish a system which employs the above-described memory device as one of the structural element, and internally operates practically at a speed higher than the frequency of the external clock.

The internal operation frequency need not be limited to twice the external clock frequency. As long as the upper frequency limit of the internal operation of the memory device is not exceeded, an arbitrarily higher multiple can be used.

The operation of the memory device according to the second embodiment of the present invention will now be described with reference to FIG. 7. As shown in this figure, the memory device includes a memory cell array 1, a row decoder 2, a column decoder 3, an address input 4, an external clock 5, a PLL circuit 6, an internal clock 7, an internal column address 9, an I/O multiplexing circuit 10, an internal I/O 11, an external I/O 12, and an address multiplexing circuit 13.

Figure 7:
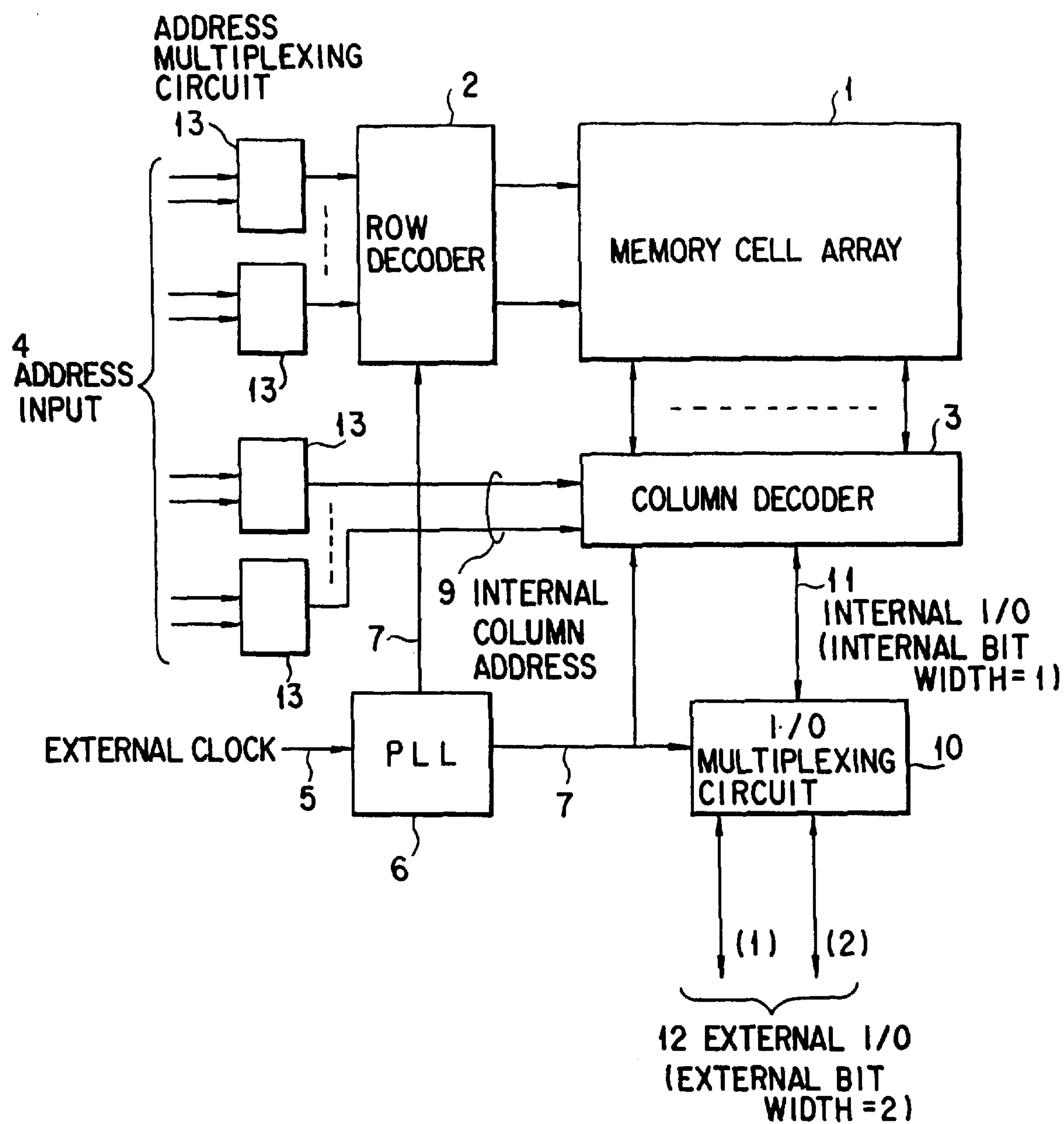
FIG. 7 is a block diagram showing the structure of a synchronous memory device according to the second embodiment of the present invention.

In FIG. 7, in order to make the description simple as in the case of FIG. 4, the internal bit width in the internal I/O is set to 1, whereas the external bit width in the external I/O is set to 2. An external I/O signal is input to the I/O multiplexing circuit 10 via the external I/O input terminals (1) and (2).

In similar to the case shown in FIG. 4, write data input to the I/O multiplexing circuit 10 via the terminals (1) and (2)

are converted from parallel signals to serial signals, and then written in the memory cell array 1 via the column decoder 3, or data written in the memory cell array 1 are converted from serial signals to parallel signals, and read from the terminals (1) and (2).

The address multiplexing circuit 13 is a circuit for multiplexing a plurality of addresses inputted to the multiplexing circuit in synchronism with the external clock 5, and generating address signals synchronizing with the internal clock multiplied with a plural number. In order to make the description simple, FIG. 7 illustrates the case where the external clock 5 is twice multiplied by the PLL circuit, to obtain the internal clock 7, and the address multiplexing circuit 13 is designed for dual multiplexing.

Figure 8:
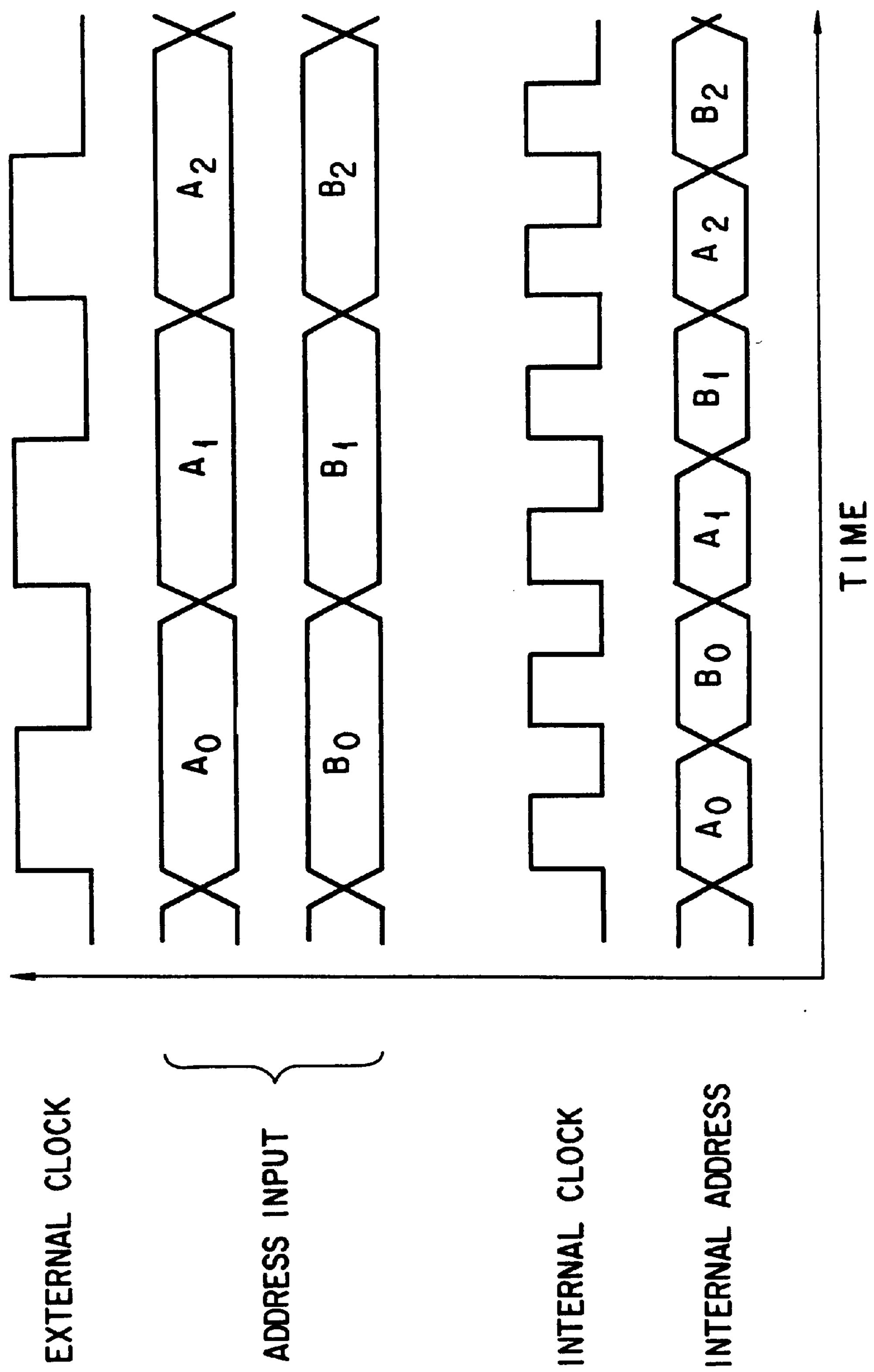
FIG. 8 is a timing diagram illustrating the operation of an address mult iplexing circuit according to the second embodiment of the present invention.

More specifically, as illustrated in the timing diagram of FIG. 8, the first time series address inputs ($A_0$, $A_1$, $A_2$, . . . ) are inputted from one input terminal (1) of the dual multiplexing circuit, and the second time series address inputs ($B_0$, $B_1$, $B_2$, . . . ) are inputted from the other input terminal (2) of the dual multiplexing circuit, in synchronism with the external clock 5.

In the meantime, as illustrated in the two items from the bottom, dual multiplexed addresses ($A_0$, $B_0$, $A_1$, $B_1$, $A_2$, $B_2$, . . . ) are transferred to the internal circuit of the memory device from the output of the dual multiplexing circuit, in synchronism with the internal clock obtained by twice multiplying the external clock. With the write and read data dual-multiplied by the I/O multiplexing circuit and transferred to the memory cell array, and the dual-multiplied address inputs designating the read and write addresses, the read and write operations from and to the memory cell array can be performed at twice the speed of the external clock.

The read and write operations of the memory device according to the second embodiment are similar to those of the first embodiment in the respects that, for example, an address input 4 is input in synchronism with the external clock 5, an internal clock 7 is obtained by twice multiplying the external clock 5 with use of a PLL circuit 6, read data is subdivided by the I/O multiplying circuit 10 into external outputs (1) and (2), and write data having an external bit width of, for example, 2 is converted into internal write data having a frequency twice as high as that of the external clock 5, and an internal bit width of 1, to be written into the memory cell.

In the first embodiment, an internal address is generated by performing an operation based on a predetermined rule, on an external address by the burst counter. By contrast, as shown in FIG. 7, in the memory device according to the second embodiment, the address input 4 is multiplexed by the address multiplexing circuit 13, and the row decoder 2 and column decoder 3 are operated are operated with use of the internal clock 7 obtained after the multiplying by the PLL circuit 6. Therefore, the internal address operation can be conducted at high speed as shown in FIG. 8.

The address multiplexing circuit 13 is a parallel serial conversion circuit. It should be noted that FIG. 7 illustrates, as an example, the case where the address input 4 is dual multiplexed so as to generate an internal address; however the present invention is not limited to the dual multiplexing, but the high speed performance of the memory device can be enhanced to its limit, using a low external clock frequency, by multiplying the internal clock 7 to the upper frequency limit of the internal operation of the memory device and multiplexing the address input by the number equal to the multiplied number for the internal clock 7.

It should be noted that the first embodiment shown in FIG. 4 carries out high-speed data writing and reading to and from the memory cell array by providing burst counters only for the column addresses so as to render the internal column address at high speed; however even a higher speed performance of the semiconductor memory device can be achieved by providing burst counters for all of the row and column addresses.

Further, in the second embodiment shown in FIG. 7, all the address inputs are multiplexed so as to be able to write or read an internal address to or from the memory cell array at high speed. However, the object of the present invention can be achieved substantially by multiplexing only the internal address group connected to the column address indicated by numeral 9 in FIG. 7.

In connection with the first and second embodiment, the high speed operation of the column address circuit is discussed to be very important, and the reason why it is very important is that, input and output of read and write data are carried out through column lines, and read and write of data to the memory cell are carried out usually for each line (word line), and therefore it becomes essential to increase the selection speed of column lines in particular.

It should be noted that the first and second embodiments are discussed in connection with the case of an internal bit width of 1 and an external bit width of 2; however it is only natural that the similar means can be applied to the case where the internal bit width is a reciprocal of integral multiple of an external bit width. It is further clear from the above description that the similar means can be applied generally in the case where an internal bit width is smaller than an external bit width.

The third embodiment, which is an applied example of the first and second embodiments, will now be described. The third embodiment is an alternative version to the first and second embodiments, where the present invention is applied to the case a memory device is assembled on a board on which an external clock and an external input/output data are transmitted, and the internal operation frequency of the memory device is sufficiently high as compared to the upper frequency limit of the signals transmitted through the wiring on the board.

An external clock frequency and an external I/O frequency are limited inevitably by the upper frequency limit of signals transmitted through the wiring on a board. Consequently, if a conventional device, in which an external clock frequency and an internal operation frequency are equal to each other, is used, the high speed performance of the internal operation cannot be achieved.

By contrast, in the case of the memory device described in the first and second embodiments, an external clock frequency is multiplied in the memory device, and a multiplied clock frequency is used as an internal clock frequency for the internal operation of the memory device. With this structure, the high speed performance of the internal operation can be enhanced to its upper limit, and thus the performance of the high speed system established on the board can be greatly improved.

Figure 9:
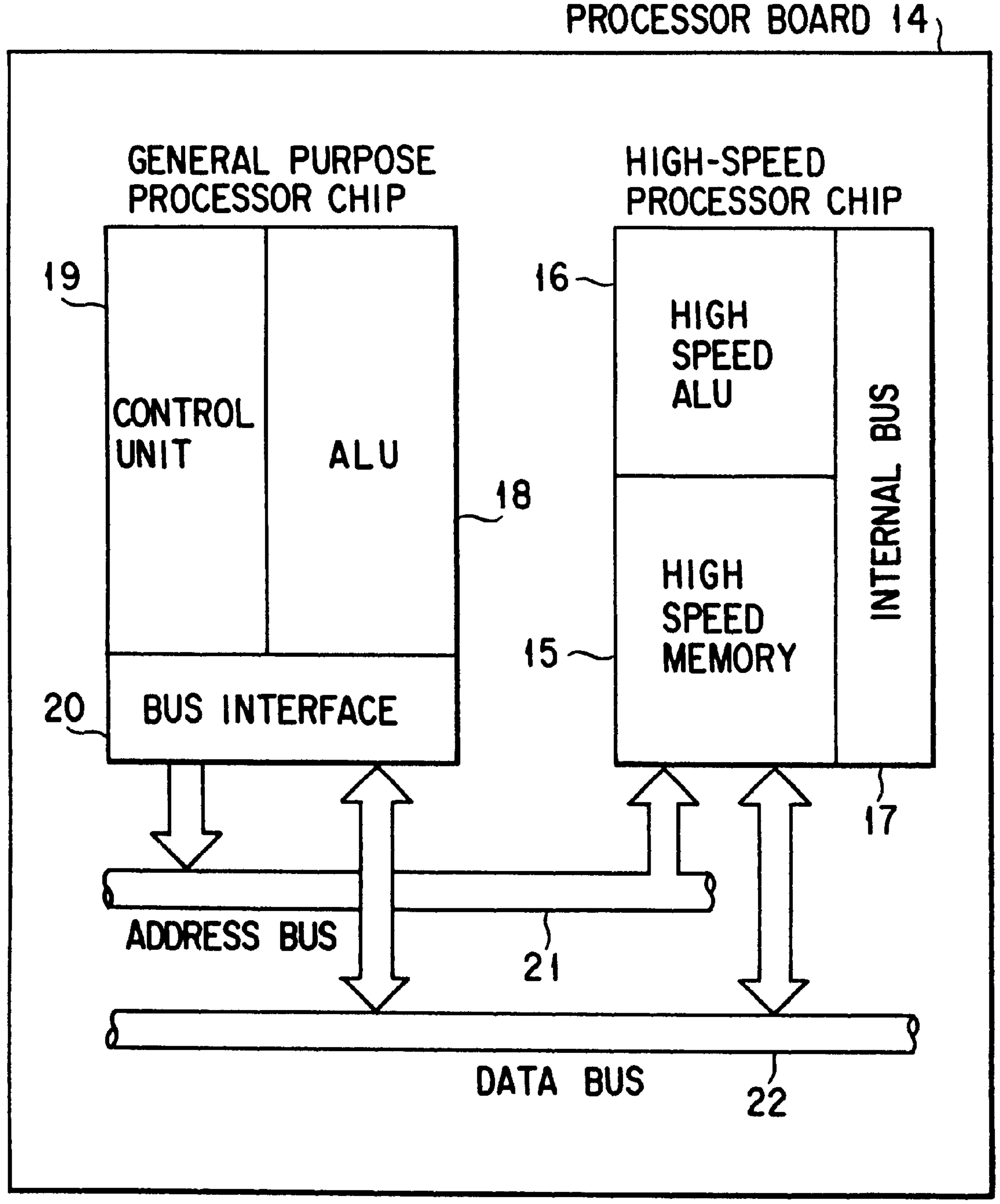
FIG. 9 is a block diagram showing the structure of a memory device assembled on a board, according to the third embodiment of the present invention.

FIG. 9 is a block diagram showing a high speed memory device of the present invention, assembled on an board, and an example of a processor board consisting of an arithmetic logic unit (ALU) and a control unit assembled on the same chip or different chips.

The processor board consists of a printing circuit board 14 on which silicon chips can be assembled, a high speed processor chip including a high speed memory device 15 of the present invention and a high-speed ALU 16 formed on the same chip as that of the memory device 15, and connected via an internal bus, a general purpose processor chip, which is separate from the high speed processor chip, consisting of an arithmetic logic unit (ALU) 18, a control unit 19 and a bus interface 20, and an address bus 21 and a data bus 22, which serve to connect both chips to each other.

There is an upper frequency limit to signals transmitted through the wiring formed on the processor board. In particular, with regard to the bus lines, since a great number of wiring lines are arranged in parallel to be very close to each other, the interwiring capacitance is increased, thus greatly dropping the upper frequency limit of the wiring. By contrast, with regard to the internal bus line on the silicon chip, it is easy to form a strip line having a high cutoff frequency on a conductive silicon substrate via a thin insulating film. Further, as compared to the case of the wiring formed on a board, it suffices only if function blocks monolithically formed on the same chip are connected to each other in the internal bus wiring on a silicon chip, and therefore the length of the wiring can be shortened.

Therefore, on the processor board, the external clock frequency for controlling the data bus and address bus, which connect the high speed processor chip and the comparatively lower speed general purpose processor chip, is lower than the internal clock frequency for controlling the internal bus which connects the high speed ALU and the high speed memory device of the present invention, in the high speed processor chip.

In the case where the memory device 15 and high speed ALU 16 are operable at a clock frequency higher than the external clock frequency, a high speed data processing can be carried out at a high internal clock frequency in the high speed processor chip consisting of the structural elements 15, 16 and 17, and the result of the processing is transferred to the general purpose processor chip consisting of the structural elements 18, 19 and 20. Thus, it becomes possible to increase the processing speed of the whole system on the processor board.

In the above-described case, the structure of the memory device of the present invention, described in the first and second embodiments, that is, the device being capable of operating at a practically high internal clock frequency generated from a low external clock frequency, can be directly applied.

Next, the fourth embodiment of the present invention, which is an applied version of the first and second embodiments, will now be described.

In the fourth embodiment, the memory device is formed on a silicon wafer obtained after finishing the wafer process, and when the function selection is made by the die sorting test, the first and second embodiments are applied. In the die sorting test, the external clock and external I/O data are supplied to the memory device on the silicon wafer from the multi-prober having a low upper frequency limit.

Figure 10A:
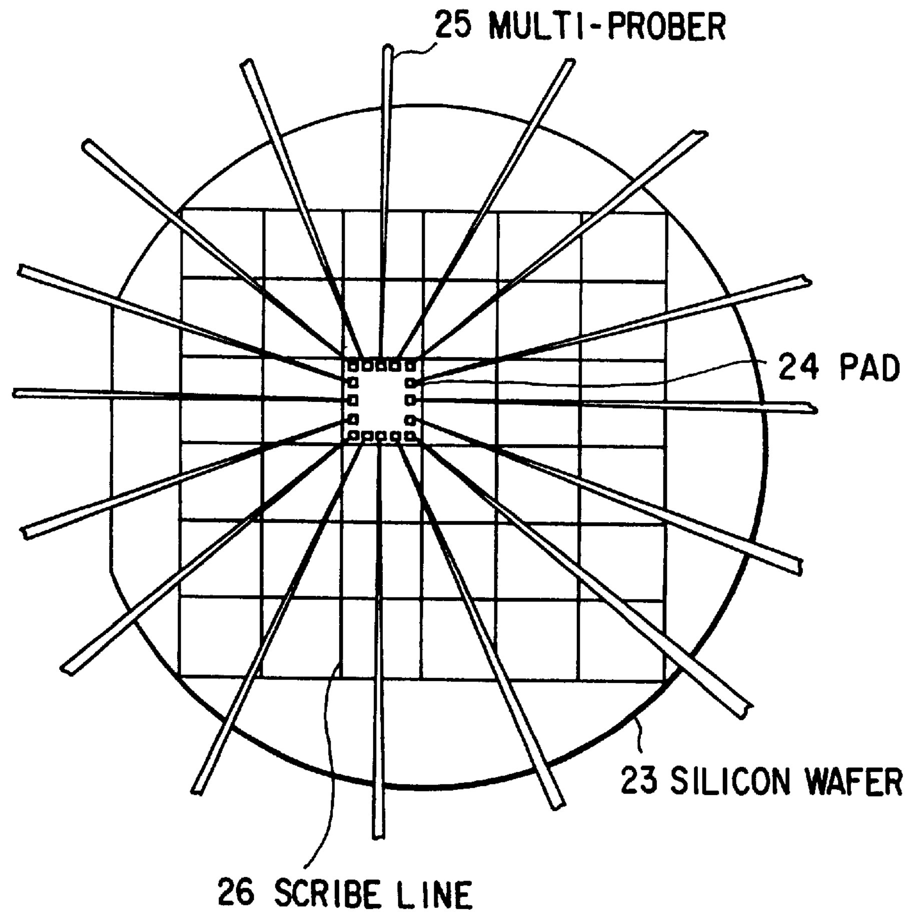
FIG. 10A is a diagram illustrating a multi-prober of a die sorting tester according to the fourth embodiment of the present invention.
Figure 10B:
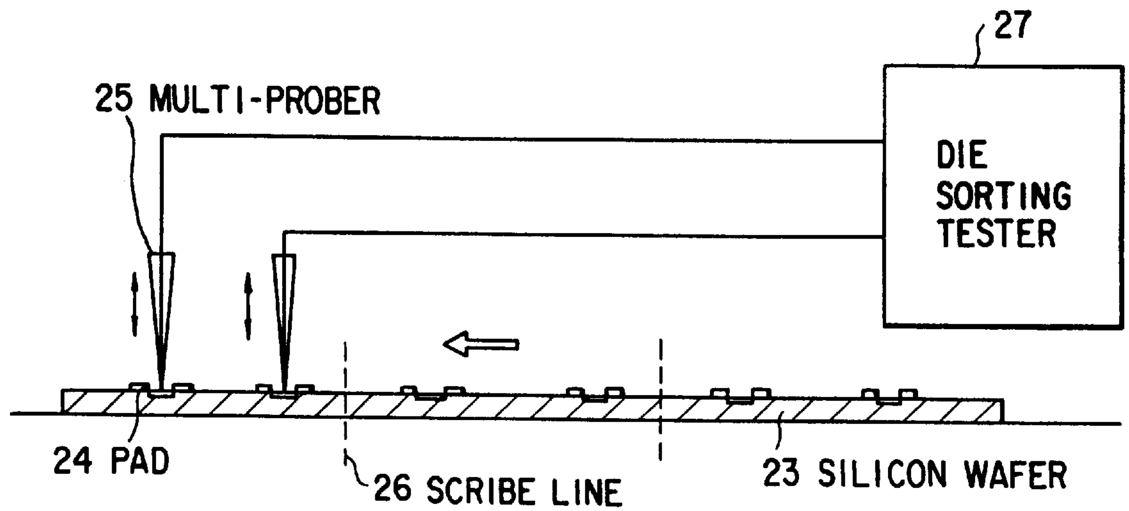
FIG. 10B is a diagram illustrating a test method for the die sorting tester according to the fourth embodiment of the present invention.

FIGS. 10A and 10B schematically show a plan view and a cross section of a multi-prober device.

As can be seen in FIG. 10A, the multi-prober is used for the function test of an integrated circuit in the following manner. That is, the tips of a great number of miniature probes 25 are brought into contact with bonding pads 24 of the integrated circuits formed on the silicon wafer 23, and thus test clock signals, test address signals and test data are input or output into or from the main section 27 of the die sorting tester as shown in FIG. 10B.

More specifically, as can be seen in FIG. 10B, the tips of the multi-probers 25 are brought into contact with the pads of the integrated circuits formed on the silicon wafer 23 one after another as indicated by arrows in the figure, thus carrying out the function test of the integrated circuits with use of the die sorting tester 27. In the test, those integral circuits which have a function fault are marked, and after separating them into chips by subscribe lines 26, nondefective devices are selected.

As a multi-prober 25, a comparatively lengthy and fine needle is used, and therefore the upper frequency limit of such a multi-prober 25 is low. Consequently, usually, the upper limit of the operation frequency of an integrated circuit cannot be measured.

For example, when the integrated circuit is a high speed memory device of the above-described type, the internal operation speed of the memory device can be evaluated using the die sorting tester 27 by making an external clock, an address input and an I/O data, having low frequencies, transferred from the die sorting tester 27, to have high frequencies, by the multiplying circuit, multiplexing circuit and burst counter.

The high frequency characteristics of a probe are gradually improved by the recent method of making a probe to have a coaxial type structure up to the vicinity of the tip of the probe. However, as the number of multi-probers is increased to follow the improvement of the integration level, there is a certain limitation to the improvement of the high frequency characteristics of a probe which requires a high technology.

Further, even if such an improvement is realized, the present situation is as follows. That is, the frequency characteristics of an improved probe are poor as compared to the high frequency performance of the test stage of the high speed function test conducted by the large sized high speed tester, after packaging. Further, the upper frequency limit of the probe is extremely low as compared to the internal operation frequency of memory devices formed on a silicon wafer.

Under these circumstances, in the case where the conventional memory devices having the external clock frequency and internal operation frequency equal to each other, are subjected to a die sorting test, devices are generally evaluated in terms of only the functions at low frequency, and the evaluation of the high-speed performance must be carried out once again separately on the test stage using the large sized high speed tester after being separated into chips.

However, with use of the memory device described in the first and second embodiments, the external clock frequency supplied via a multi-prober 25 is multiplied within the memory device, and using the multiplied frequency as an internal clock frequency, the internal operation of the memory device is carried out. With this structure, the function and high speed performance of the memory devices on the silicon wafer can be evaluated to their limit value in the die sorting test. Consequently, the test time is shortened, and the testing cost is decreased. At the same time, the number of defective devices resulting after being sealed in the expensive high-speed packages can be significantly decreased.

In connection with the first embodiment, it is described that the memory device of the present invention has a burst mode. In the burst mode, an operation based on a certain rule is added to an external address inputted to the burst counter circuit, and new internal address which is in synchronism with the internal clock frequency is generated in time series.

In the timing diagram shown in FIG. 5, which illustrates the read operation of the first embodiment, when a mutual operation rule of internal addresses $A_1$, $A_1^*$, . . . , is given to the burst counter circuit, such that read data $Q_1$, $Q_1$*, . . . , read from the memory cell 1, and write data $D_1$, $D_1$*, . . . , written in the memory cell 1, on the basis of the internal column addresses $A_1$, $A_1$*, . . . , form such a test pattern that gives the optimum fault detection rate for the memory device of the present invention, the efficiency of the die sorting test of the fourth embodiment can be enhanced.

It is natural that the worst-case test pattern can be easily formed for the memory device discussed in the second embodiment, which employs the address multiplexing circuit shown in FIG. 7.

The present invention is not limited the above-described embodiments, but it can be modified into various versions as long as the essence of the invention remains.

As described above, with the memory device of the present invention, the internal operation can be carried out at a frequency higher than those of the external clock and I/O signal frequency, and thus it can be conducted at a frequency higher than the upper frequency limit of the assemble board on which the external clock and I/O signals are transferred.

Further, in the die sorting test, the operation speed of the memory device can be evaluated up to a frequency higher than the operation frequency of the die sorting tester, and therefore the yield of the speed selection after sealing the package can be improved.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

We claim:

1. A memory device for performing write and read operations of external input and output data in synchronism with an external clock, comprising:

- a multiplying circuit for generating an internal clock obtained by multiplying the external clock by a value by using said multiplying circuit;
- an external I/O for performing write and read operations to and from said memory device at a predetermined external bit width; and
- an internal I/O for performing write and read operations to and from a memory cell array of said memory device at a predetermined internal bit width,
- wherein the write and read operations to and from said memory cell array are controlled by said internal clock, and said internal bit width is set smaller than said external bit width.

2. The memory device according to claim 1, wherein said memory device is assembled on a board, said external clock and said external input and output data are propagated on said board, and the write and read operations of said external input and output data are performed in synchronism with said external clock.

3. The memory device according to claim 2, wherein the external input data of the write operation is converted from parallel to serial by an I/O multiplexing circuit, and written in the memory cell array of said memory device, and the external output data of the read operation is converted from serial to parallel by said I/O multiplexing circuit, and read from the memory cell array of said memory device to outside.

4. The memory device according to claim 2, wherein said memory device has a burst mode such that an address input signal inputted in synchronism with said external clock is converted to an internal address signal having a same frequency as that of said internal clock by a burst counter circuit which operates in synchronism with said internal clock.

5. The memory device according to claim 4, wherein a test pattern of said memory device having a high fault detection rate is formed by using the internal address signal converted to have the same frequency as that of said internal clock by said burst mode, and write and read test data converted to have the same frequency as that of said internal address signal by an I/O multiplexing circuit.

6. The memory device according to claim 2, wherein said memory device has a burst mode such that a column address input signal inputted in synchronism with said external clock is converted to an internal column address signal having a same frequency as that of said internal clock by a burst counter circuit which operates in synchronism with said internal clock.

7. The memory device according to claim 6, wherein a test pattern of said memory device having a high fault detection rate is formed by using the internal column address signal converted to have the same frequency as that of said internal clock by said burst mode, and write and read test data converted to have the same frequency as that of said internal column address signal by an I/O multiplexing circuit.

8. The memory device according to claim 1, wherein said internal clock obtained by multiplying said external clock by said value has a higher multiple of a frequency said external clock.

9. The memory device according to claim 8, wherein the external input data of the write operation is converted from parallel to serial by an I/O multiplexing circuit, and written in the memory cell array of said memory device, and the external output data of the read operation is converted from serial to parallel by said I/O multiplexing circuit, and read from the memory cell array of said memory device to outside.

10. The memory device according to claim 8, wherein said memory device has a burst mode such that an address input signal inputted in synchronism with said external clock is converted to an internal address signal having a same frequency as that of said internal clock by a burst counter circuit which operates in synchronism with said internal clock.

11. The memory device according to claim 10, wherein a test pattern of said memory device having a high fault detection rate is formed by using the internal address signal converted to have the same frequency as that of said internal clock by said burst mode, and write and read test data converted to have the same frequency as that of said internal address signal by an I/O multiplexing circuit.

12. The memory device according to claim 8, wherein said memory device has a burst mode such that a column address input signal inputted in synchronism with said external clock is converted to an internal column address signal having a same frequency as that of said internal clock by a burst counter circuit which operates in synchronism with said internal clock.

13. The memory device according to claim 12, wherein a test pattern of said memory device having a high fault detection rate is formed by using the internal column address signal converted to have the same frequency as that of said internal clock by said burst mode, and write and read test data converted to have the same frequency as that of said internal column address signal by an I/O multiplexing circuit.

14. The memory device according to claim 1, wherein the external input data of the write operation is converted from parallel to serial by an I/O multiplexing circuit, and written in the memory cell array of said memory device, and the external output data of the read operation is converted from serial to parallel by said I/O multiplexing circuit, and read from the memory cell array of said memory device to outside.

15. The memory device according to claim 1, wherein said memory device has a burst mode such that an address input signal inputted in synchronism with said external clock is converted to an internal address signal having a same frequency as that of said internal clock by a burst counter circuit which operates in synchronism with said internal clock.

16. The memory device according to claim 15, wherein a test pattern of said memory device having a high fault detection rate is formed by using the internal address signal converted to have the same frequency as that of said internal clock by said burst mode, and write and read test data converted to have the same frequency as that of said internal address signal by an I/O multiplexing circuit.

17. The memory device according to claim 1, wherein said memory device has a burst mode such that a column address input signal inputted in synchronism with said external clock is converted to an internal column address signal having a same frequency as that of said internal clock by a burst counter circuit which operates in synchronism with said internal clock.

18. The memory device according to claim 17, wherein a test pattern of said memory device having a high fault detection rate is formed by using the internal column address signal converted to have the same frequency as that of said internal clock by said burst mode, and write and read test data converted to have the same frequency as that of said internal column address signal by an I/O multiplexing circuit.

19. The memory device according to claim 1, wherein said multiplying circuit is formed of a PLL circuit.

20. A memory device for performing write and read operations of external input and output data in synchronism with an external clock, comprising:

a multiplying circuit for generating an internal clock obtained by multiplying the external clock by a value by using said multiplying circuit;

an external I/O for performing write and read operations to and from said memory device at a predetermined external bit width; and an internal I/O for performing write and read operations to and from a memory cell array of said memory device at a predetermined internal bit width, wherein the write and read operations to and from said memory cell array are controlled by said internal clock, said internal bit width is set smaller than said external bit width, and an address input signal inputted in parallel in synchronism with said external clock is converted to a serial internal address signal having a same frequency as that of said internal clock by using an address multiplying circuit, and inputted to a decoder circuit.

21. The memory device according to claim 20, wherein said internal clock obtained by multiplying said external clock by said value has a higher multiple of a frequency of said external clock.

22. The memory device according to claim 20, wherein said multiplying circuit is formed of a PLL circuit.

23. A memory device for performing write and read operations of external input and output data in synchronism with an external clock, comprising:

a multiplying circuit for generating an internal clock obtained by multiplying the external clock by a value by using said multiplying circuit;

an external I/O for performing write and read operations to and from said memory device at a predetermined external bit width; and an internal I/O for performing write and read operations to and from a memory cell array of said memory device at a predetermined internal bit width, wherein said internal bit width is set smaller than said external bit width, an operation of an internal circuit is controlled by said internal clock, and a column address input signal inputted in parallel in synchronism with said external clock is converted to a serial internal column address signal having a same frequency as that of said internal clock by using a column address multiplexing circuit, and inputted to a column decoder circuit.

24. The memory device according to claim 23, wherein said internal clock obtained by multiplying said external clock by said value has a higher multiple of a frequency of said external clock.

25. The memory device according to claim 23, wherein said multiplying circuit is formed of a PLL circuit.

* * * * *